United States Patent
Lee et al.

(10) Patent No.: US 10,127,956 B2
(45) Date of Patent: Nov. 13, 2018

(54) SPIN ORBIT TORQUE MAGNETIC MEMORY DEVICE

(71) Applicant: KOREA UNIVERSITY RESEARCH AND BUSINESS FOUNDATION, Seoul (KR)

(72) Inventors: Kyung Jin Lee, Seoul (KR); Hyun Woo Lee, Gyeongsangbuk-do (KR); Byong Guk Park, Daejeon (KR)

(73) Assignee: Korea University Research and Business Foundation, Seoul (KR)

(*) Notice: Subject to any disclaimer, the term of this patent is extended or adjusted under 35 U.S.C. 154(b) by 0 days.

(21) Appl. No.: 15/655,212

(22) Filed: Jul. 20, 2017

(65) Prior Publication Data
US 2017/0316813 A1    Nov. 2, 2017

Related U.S. Application Data

(63) Continuation of application No. PCT/KR2016/004964, filed on May 12, 2016.

(30) Foreign Application Priority Data

May 13, 2015    (KR) .................. 10 2015 0066853

(51) Int. Cl.
    *G11C 11/16*      (2006.01)
    *G11C 11/4074*      (2006.01)
    (Continued)

(52) U.S. Cl.
    CPC .......... *G11C 11/02* (2013.01); *G11C 11/1675* (2013.01); *G11C 11/18* (2013.01);
    (Continued)

(58) Field of Classification Search
CPC ..... G11C 11/15; G11C 11/4074; H01L 43/08; H01L 43/04; H01L 43/10
See application file for complete search history.

(56) References Cited

U.S. PATENT DOCUMENTS

| | | | | |
|---|---|---|---|---|
| 6,430,084 B1* | 8/2002 | Rizzo | .................. | G11C 11/16 257/E27.005 |
| 6,909,633 B2* | 6/2005 | Tsang | .................. | G11C 11/16 365/158 |
| 6,977,801 B2 | 12/2005 | Carey et al. | | |
| 7,038,939 B2* | 5/2006 | Amano | .................. | G11C 11/15 365/158 |

(Continued)

FOREIGN PATENT DOCUMENTS

| KR | 10-1266791 B1 | 5/2013 |
|---|---|---|
| KR | 10-2014-0027036 A | 3/2014 |

(Continued)

OTHER PUBLICATIONS

English Translation of the IPRP and Written Opinion for Application No. PCT/KR2016/004964 dated Nov. 14, 2017.

(Continued)

*Primary Examiner* — Tri Hoang
(74) *Attorney, Agent, or Firm* — Jenkins, Wilson, Taylor & Hunt, P.A.

(57) ABSTRACT

A magnetic memory device may include tunnel junction unit cells, each including a pinned magnetic layer, an insulating layer, and a free magnetic layer which are sequentially stacked, a conductive line structure configured to supply an in-plane current to the unit cells and to include an antiferromagnetic layer, which is provided adjacent to the free magnetic layer, and a ferromagnetic layer, which is provided adjacent to the antiferromagnetic layer and has an in-plane magnetic anisotropy, and a voltage applying unit configured to independently apply a selection voltage to each of the tunnel junction unit cells. Each of the tunnel junction unit cells may have a magnetization direction that is selectively changed by the in-plane current and the selection voltage.

8 Claims, 9 Drawing Sheets

Magnetic Tunnel Junction Cell (401) in contact with the conductive line

(51) Int. Cl.
*G11C 11/15* (2006.01)
*H01L 43/10* (2006.01)
*H01L 43/08* (2006.01)
*H01L 43/04* (2006.01)
*G11C 11/02* (2006.01)
*H01L 43/02* (2006.01)
*G11C 11/18* (2006.01)

(52) U.S. Cl.
CPC .............. *H01L 43/02* (2013.01); *H01L 43/08* (2013.01); *H01L 43/10* (2013.01)

(56) References Cited

U.S. PATENT DOCUMENTS

| | | | | |
|---|---|---|---|---|
| 7,826,258 | B2 * | 11/2010 | Zhu | G11C 11/15 365/130 |
| 7,944,738 | B2 * | 5/2011 | Liu | B82Y 25/00 365/158 |
| 9,076,537 | B2 | 7/2015 | Khvalkovskiy et al. | |
| 9,236,105 | B2 | 1/2016 | Pi et al. | |
| 2015/0236071 | A1 * | 8/2015 | Lee | H01L 27/222 257/421 |
| 2016/0359102 | A1 * | 12/2016 | Hong | H01L 43/08 |

FOREIGN PATENT DOCUMENTS

| KR | 10-2014-0113174 A | 9/2014 |
|---|---|---|
| KR | 10-2015-0015602 A | 2/2015 |
| KR | 2004-260149 A | 3/2018 |

OTHER PUBLICATIONS

Chen, et al., "Anomalous Hall Effect Arising from Noncollinear Antiferromagnetism," Physical Review Letters, 112, 017205, pp. 017205-1-017205-5 dated Jan. 10, 2014.

International Search Report for Application No. PCT/KR2016/004964 dated Aug. 2, 2016.

Garello, et al., "Symmetry and magnitude of spin-orbit torques in ferromagnetic heterostructures," Nature Nanotechnology, DOI: 10.1038/NNANO.2013.145, vol. 8, pp. 587-593 dated Jul. 28, 2013.

Mendes, et al., "Large inverse spin Hall effect in the antiferromagnetic metal Ir20Mn80," Physical Review B 89, 140406(R), pp. 140406-1-140406-5 dated Apr. 17, 2014.

Miron, et al., "Perpendicular switching of a single ferromagnetic layer induced by in-plane current injection," Nature, DOI: 10.1038/nature10309, vol. 476, pp. 189-193 dated Aug. 11, 2011.

* cited by examiner

SPIN ORBIT TORQUE MAGNETIC MEMORY DEVICE

CROSS-REFERENCE TO RELATED APPLICATIONS

This application is a continuation of and claims priority to PCT/KR2016/004964 filed on May 12, 2016, which claims priority to Korea Patent Application No. 10-2015-0066853 filed on May 13, 2015, the entirety of which is incorporated by reference herein.

BACKGROUND

The present disclosure relates to a spin transfer torque magnetic memory device, and in particular, to a magnetic memory device, in which magnetization reversal of a free magnetic layer of a magnetic tunnel junction of a unit cell is used to store or read data.

A ferromagnetic material is a material exhibiting a spontaneous magnetization property, even when there is no external magnetic field. A tunnel junction unit cell includes a magnetic tunnel junction (MTJ) structure, in which two ferromagnetic layers and an insulating layer therebetween (e.g., a first ferromagnetic layer, an insulating layer, and a second ferromagnetic layer) are provided.

Electric resistance of the MTJ structure is changed depending on relative orientation between the magnetization directions of the first and second ferromagnetic layers. This is called a tunneling magnetoresistance effect and results from a difference between the tunneling of up- and down-spin electrons through the insulating layer. Due to the tunneling magnetoresistance effect, the relative orientation between the magnetization directions of the first and second ferromagnetic layers may be used to control a current flowing through the tunnel junction unit cell.

Meanwhile, according to the Newton's third law, namely the law of action and reaction, if a flow of current can be controlled by the magnetization direction, it is also possible to control a magnetization direction of the magnetic layer by applying a current by the reaction. In the case that there is a current flowing through the MTJ structure in a thickness direction perpendicular to the tunnel junction unit cell, a spin-polarized current caused by the first or pinned magnetic layer may pass through the second or free magnetic layer, and spin angular momentum of the spin-polarized current may be transferred to magnetization of the second magnetic layer. This process is called 'spin transfer torque', and a magnetization direction of the free magnetic layer may be reversed or changed by using the spin transfer torque.

FIG. 1 is a sectional view illustrating a structure of a conventional spin transfer torque magnetic memory device.

Referring to FIG. 1, a conventional magnetic memory device includes a tunnel junction unit cell having ferromagnetic layers, each of which has a magnetization perpendicular to a surface thereof, and an insulating layer, which is interposed between the ferromagnetic layers.

That is, the magnetic memory device includes a first electrode, a tunnel junction unit cell, and a second electrode, and the tunnel junction unit cell includes a first or pinned magnetic layer 101, an insulating layer 102, and a second or free magnetic layer 103 whose magnetization direction can be changed by an electric current. Here, the second magnetic layer is connected to the electrode, and in this case, a current flowing in a direction perpendicular to a surface of a layer can be used to induce magnetization reversal. Depending on relative orientation between magnetization directions of the pinned and free magnetic layers, electrical signals can have two different resistance states of high resistance and low resistance, and this may be used to realize a magnetic memory device, in which data of "0" or "1" are stored.

Meanwhile, in the case that an external magnetic field, not electric current, is used to control the magnetization of the free magnetic layer, the smaller the device, the more difficult it is to avoid an issue of half-selected cell, and thus, it is difficult to realize a highly integrated magnetic memory device. By contrast, in the case that the spin transfer torque produced by the electric current is used, it is easy to reverse magnetization of a selected cell, regardless of a size of the device.

In the afore-described spin transfer torque magnetic memory device using electric current, a magnitude of a spin transfer torque produced in the free magnetic layer may be determined by a current density applied thereto. This means that there is a critical current density for magnetization reversal of the free magnetic layer.

In the case that both of the pinned and free magnetic layers are formed of a material with perpendicular magnetic anisotropy (PMA), the critical current density $J_C$ may be given by the following equation 1.

$$J_C = \frac{2e}{\hbar}\frac{\alpha M_S d}{\eta}(H_{K\perp} - N_d M_S) = \frac{2e}{\hbar}\frac{\alpha M_S d}{\eta}(H_{K,\text{eff}}) \quad \text{[Equation 1]}$$

where $\alpha$ is the Gilbert damping constant, $\hbar$ ($=1.05\times10^{-34}$ J·s) is equal to the Planck constant divided by $2\pi$, e ($=1.6\times10^{-19}$ C) is the electric charge of an electron, $\eta$ is a spin polarization efficiency constant which is determined by a material and a structure of a device and has a value between 0 and 1, $M_S$ is a saturation magnetization of a magnetic material, d is a thickness of a free magnetic layer, $H_{K\perp}=(2K_\perp/M_S)$ is a PMA field of the free magnetic layer, $K_\perp$ is a PMA energy density of the free magnetic layer, $H_{K,\text{eff}}$ is an effective anisotropy field, in a perpendicular direction, of the free magnetic layer and is defined as $H_{K,\text{eff}}=(H_{K\perp}-N_d M_S)$, and Nd is an effective demagnetization field constant in a perpendicular direction and has a value between 0 to $4\pi$ in CGS units, depending on a shape of the free magnetic layer.

If a size of a magnetic junction unit cell included in a highly-integrated memory device decreases, there may be a superparamagnetic limit, at which a direction of magnetization written is arbitrarily changed due to heat energy at room temperature. This may lead to a problem such as an unintended erase of written magnetic information. Time $\tau$, in which magnetization direction is averagely maintained against heat energy, is given by the following equation 2.

$$\tau = \tau_0 \exp\left(\frac{K_{\text{eff}} V}{k_B T}\right) = \tau_0 \exp\left(\frac{H_{K_{\text{eff}}} M_s V}{2 k_B T}\right) \quad \text{[Equation 2]}$$

where $\tau$ is a reciprocal of attempt frequency and has a value of about 1 ns, $K_{\text{eff}}$ is an effective magnetic anisotropy energy density ($=H_{K,\text{eff}}M_S/2$) of the free magnetic layer, V is a volume of the free magnetic layer, $k_B$ is the Boltzmann's constant ($=1.381\times10-16$ erg/K), and T is a Kelvin temperature.

In addition, $K_{\text{eff}}V/K_B T$ is defined as thermal stability $\Delta$ of a magnetic memory device. The condition of $\Delta>50$ should be generally satisfied for the purpose of commercializing it as a nonvolatile memory device. If a volume V of the free magnetic layer is reduced to realize a highly-integrated device, $K_{eff}$ should be increased to meet the condition of $\Delta>50$.

However, in the case that the effective magnetic anisotropy energy density $K_{eff}$ of the free magnetic layer is increased, there may be a problem, such as an increase of the critical current density $J_C$.

In the case where a spin transfer torque is used to induce the magnetization reversal in the conventional structure illustrated in FIG. 1, it is very difficult to obtain a sufficiently high thermal stability $\Delta$ and a sufficiently low critical current density $J_C$ that are suitable for commercialization, because both of the thermal stability $\Delta$ and the critical current density $J_C$ are proportional to $K_{eff}$.

In addition, an amount of a current, which can be supplied through a current-applying device (e.g., a transistor) for supply a current to an MTJ structure, may generally be proportional to a size of the current-applying device. This means that, in order to supply a current density greater than the critical current density $J_C$, the size of the device should be maintained to be larger than a proper size. Accordingly, the size of the current-supplying part for supplying a current greater than $J_C$ may set a limit on an integration density of a magnetic memory device.

Also, in the case where, in a conventional structure, a current flows through an MTJ structure, the larger the thickness of the insulating layer, the larger a difference between an up-spin and a down-spin of a tunneling electron, and this may lead to an increase in tunneling magnetoresistance. However, the larger the thickness of the insulating layer, the smaller an amount of a tunneling current itself, and thus, it may be difficult to effectively transfer a spin transfer torque for the magnetization reversal to the magnetization of the free magnetic layer. In other words, if the insulating layer is thickened, a value of tunneling magnetoresistance may be increased to make it possible to read a magnetization state at a very fast speed, but it may lead to a reduction in current density. Accordingly, it may be difficult to realize a magnetic memory device satisfying both requirements for the tunneling magnetoresistance and the current density.

FIG. 2 is a sectional view illustrating a conventional magnetic memory device including tunnel junction unit cells, each of which has a conventional MTJ structure using a spin-orbit spin transfer torque and an external magnetic field.

FIG. 2 illustrates a magnetic memory device using a spin-orbit spin transfer torque, which was invented and filed by one of the inventors of the present application and was issued as Korea Patent No. 10-1266791, and the magnetic memory device of FIG. 2 may be used to overcome the afore-described problems. It may be possible to overcome two problems in the conventional MTJ structure, in which a spin transfer torque by a current flowing in a perpendicular direction is used to induce magnetization reversal of a free magnetic layer. In other words, it may be possible to overcome the problems of (i) since the critical current density and the thermal stability are proportional to the same material parameter (i.e., $K_{eff}$ or the effective magnetic anisotropy energy density of the free magnetic layer), it is difficult to meet both requirements for commercialization (i.e., the sufficiently low critical current density and the sufficiently high thermal stability) and (ii) if an insulating layer of the MTJ structure is thickened, the tunneling magnetoresistance is increased to more quickly read a magnetization state, but the current density is decreased to make it difficult to change the magnetization state.

Furthermore, in order to realize a highly-integrated magnetic memory device, a conductive line having a non-magnetic property may be provided adjacent to a free magnetic layer. In such a magnetic memory device, by using a spin Hall effect or Rashba effect to be caused by an in-plane current flowing through the conductive line, it may be possible to induce the magnetization reversal of the free magnetic layer through a spin-orbit spin transfer torque. In addition, the magnetic memory device may be configured in such a way that the magnetization reversal of each cell can be selectively realized using a voltage to be selectively applied to each MTJ memory cell.

However, in order to operate a conventional magnetic memory using spin-orbit spin transfer torque, an additional in-plane magnetic field is necessarily required. This is because an antidamping torque $\tau_A$, an antidamping component of the spin-orbit spin transfer torque inducing the switching of the perpendicular magnetization, is given by the following equation.

$$\tau_A = \gamma c_J \hat{m} \times (\hat{m} \times \hat{y}) \qquad \text{[Equation 3]}$$

where $\gamma$ is a gyromagnetic ratio, $C_J$ is a magnitude of an antidamping component of a spin-orbit spin torque, which is expressed in the unit of magnetic field and is proportional to a current density, $\hat{m}$ is a unit vector of a magnetization direction of a free magnetic layer, and $\hat{y}$ is a unit vector of a direction which is perpendicular to both of a current direction $\hat{x}$ and a perpendicular direction $\hat{z}$ of the MTJ.

In the case where a sufficiently high current density is applied, the magnetization direction $\hat{m}$ is changed until $\tau_A$ reaches zero, and thus, $\hat{m}$ is aligned to $+\hat{y}$ or $-\hat{y}$ direction, depending on a sign of a current flowing in $\hat{x}$ direction. In other words, when the magnetization is aligned to a perpendicular direction ($+\hat{z}$ or $-\hat{z}$) before applying the current density, and then, if a spin-orbit spin transfer torque is applied thereto, the magnetization direction is aligned to $+\hat{y}$ or $-\hat{y}$ direction, depending on a sign of the current.

Next, if the current is turned off in this state, due to the PMA, it may be aligned to $+\hat{z}$ or $-\hat{z}$ direction with probability of half (½). That is, in the case where only a spin-orbit spin transfer torque is applied, it is hard to selectively change a magnetization direction after a switching operation. However, in order to apply a tunnel junction unit cell using the spin-orbit spin transfer torque to a memory device, it is necessary to selectively change a magnetization direction after a switching operation.

In the case where, to selectively change a magnetization direction after a switching operation, an in-plane magnetic field is applied together with a spin-orbit spin transfer torque, a magnetization direction may have a perpendicular component that is not parallel to the $\hat{y}$ direction. Thus, if both of the spin-orbit spin transfer torque and the in-plane magnetic field are applied, it may be possible to realize a selective switching (e.g., see I. M. Miron et al., Nature 476, 189 (2011)).

However, in order to produce an additional in-plane magnetic field, it is necessary to provide an additional circuit for applying a uniform magnetic field throughout a magnetic memory array, to provide an additional conductive line for generating a magnetic field using a current, or to provide an additional horizontal magnetic layer for generating an in-plane magnetic field in a portion of the MTJ structure. This may lead to problems, such as an additional power loss, an increase in total thickness of the structure, and an increase in fabrication cost.

SUMMARY

Some embodiments of the inventive concept provide a spin transfer torque magnetic memory device with a magnetic tunnel junction (MTJ) structure which is configured to realize a sufficiently low critical current density and sufficiently high thermal stability and to increase not only tunneling magnetoresistance but also current density.

Furthermore, in a conventional structure, in which a spin-orbit spin transfer torque by an in-plane current is used to induce magnetization reversal of a free magnetic layer, it is necessary to produce an external magnetic field, but according to some embodiments of the inventive concept, it may be possible to realize a highly-integrated magnetic memory device without providing an additional external magnetic field.

According to some embodiments of the inventive concept, a magnetic memory device may include tunnel junction unit cells, each including a pinned magnetic layer, an insulating layer, and a free magnetic layer which are sequentially stacked, a conductive line structure configured to supply an in-plane current to the unit cells, the conductive line structure including an antiferromagnetic layer, which is provided adjacent to the free magnetic layer, and a ferromagnetic layer, which is provided adjacent to the antiferromagnetic layer and has an in-plane magnetic anisotropy, and a voltage applying unit configured to independently apply a selection voltage to each of the tunnel junction unit cells. Each of the tunnel junction unit cells may have a magnetization direction that is selectively changed by the in-plane current and the selection voltage.

In some embodiments, the pinned magnetic layer and the free magnetic layer may be formed of at least one of ferromagnetic materials, in which at least one selected from the group consisting of Fe, Co, Ni, B, Si, Zr, Pt, Tb, Pd, Cu, and W is contained.

In some embodiments, the insulating layer may be formed of a material selected from AlOx, MgO, TaOx, ZrOx, and mixtures thereof.

In some embodiments, each of the antiferromagnetic and ferromagnetic layers included in the conductive line structure may be formed of at least one of metallic materials, in which at least one selected from the group consisting of Co, Fe, Ni, O, N, Cu, Ta, Pt, W, Hf, Ir, Rh, Pd, Gd, Bi, Ir, and Mn is contained.

In some embodiments, the antiferromagnetic layer may be formed of a material having a ferrimagnetic property and may be provided to be in surface contact with the free magnetic layer.

In some embodiments, the conductive line structure may be configured to induce a horizontal exchange bias field in the free magnetic layer, and a current flowing through the conductive line structure may be used to produce a spin-orbit spin torque.

In some embodiments, the antiferromagnetic layer and the ferromagnetic layer may be provided to be in surface contact with each other.

In some embodiments, the ferromagnetic layer may be configured to induce a horizontal exchange bias in the antiferromagnetic layer, through a thermal annealing process under a horizontal magnetic field.

DETAILED DESCRIPTION

Figure 1:
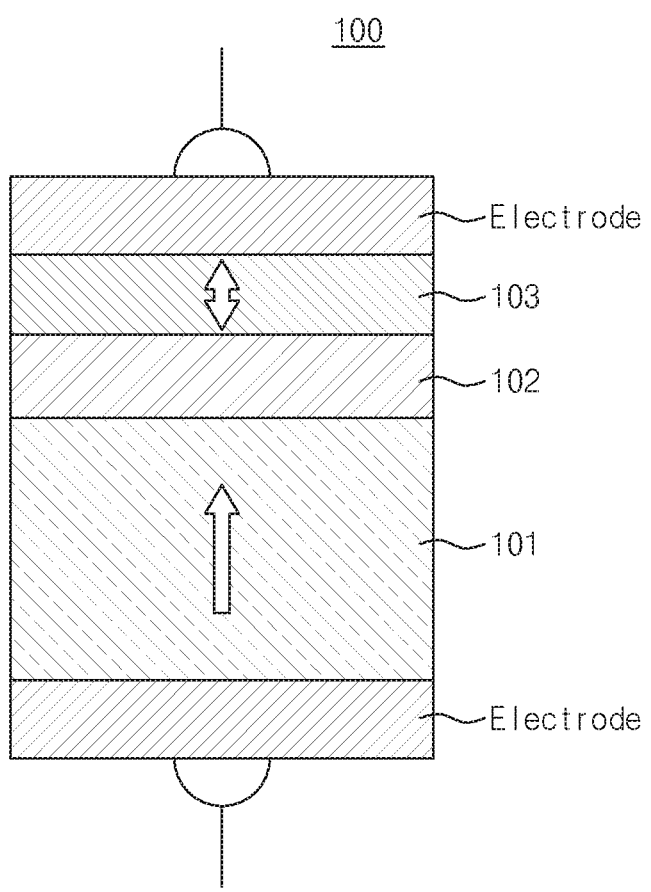
FIG. 1 is a sectional view illustrating a structure of a conventional spin transfer torque magnetic memory device.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 3:
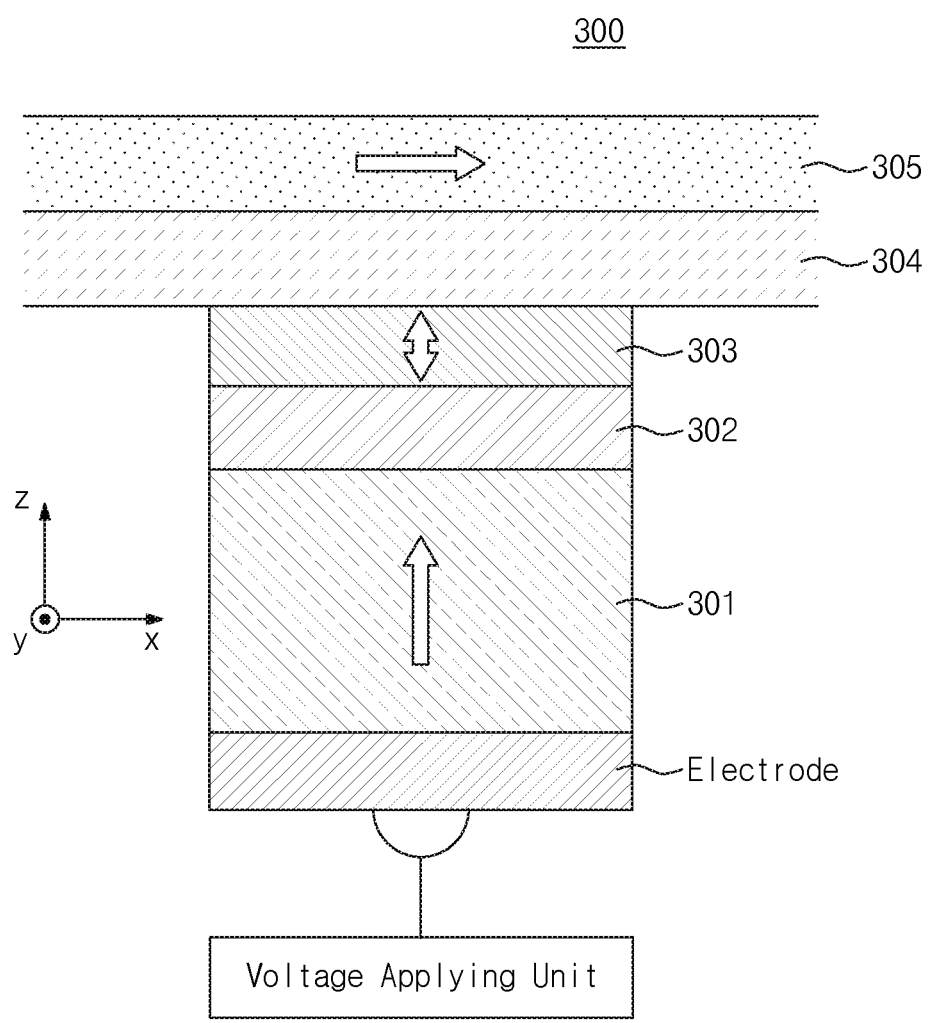
FIG. 3 is a sectional view illustrating a magnetic memory device according to some embodiments of the inventive concept.

FIG. 3 is a sectional view illustrating a magnetic memory device according to some embodiments of the inventive concept.

Referring to FIG. 3, a magnetic memory device according to some embodiments of the inventive concept may include a tunnel junction unit cell, a conductive line structure, and a voltage applying unit.

The tunnel junction unit cell may include a pinned magnetic layer 301 having a perpendicular magnetization direction, an insulating layer 302, and a free magnetic layer 303.

A magnetization direction of the free magnetic layer 303 may be selectively changed by an in-plane current, which flows through the conductive line structure, and an electric field. The free magnetic layer 303 may be configured to exhibit a PMA property.

The pinned magnetic layer 301 and the free magnetic layer 303 may be formed of Fe, Co, Ni, B, Si, Zr, Pt, Tb, Pd, Cu, or W.

The pinned magnetic layer 301 may be a multi-layered structure including double-layered structures, which are stacked n-time, and each of which includes sequentially-stacked two layers (e.g., X and Y). For example, the pinned magnetic layer 301 may have a structure of $(X/Y)_n$, where $n \geq 1$.

The pinned magnetic layer 301 may have an antiferromagnetic structure including a first magnetic layer, a non-magnetic layer, and a second magnetic layer. Here, each of the first magnetic layer and the second magnetic layer may be independently formed of Fe, Co, Ni, B, Si, Zr, Pt, Tb, Pd, Cu, W, or Ta. In addition, the non-magnetic layer may include Ru, Cu, W, Hf, or Ta.

In certain embodiments, the pinned magnetic layer 301 may have an exchange-biased antiferromagnetic structure including an antiferromagnetic layer, a first magnetic layer, a non-magnetic layer, and a second magnetic layer.

The conductive line structure may include an antiferromagnetic layer 304, which is provided adjacent to the free magnetic layer included in the unit cell, and a ferromagnetic layer 305, which is provided adjacent to the antiferromagnetic layer 304.

The ferromagnetic layer 305 may be provided adjacent to the antiferromagnetic layer 304. For example, the ferromagnetic layer 305 may be provided on the antiferromagnetic layer 304 to be in surface contact with the antiferromagnetic layer 304. In addition, the ferromagnetic layer 305 may have an in-plane magnetic anisotropy. Here, for the magnetization reversal of the free magnetic layer 303, an electric current flowing through the conductive line structure 304/305 may have an in-plane direction.

The antiferromagnetic layer 304 may be antiferromagnetically aligned to the in-plane direction, due to the ferromagnetic layer 305 in surface contact with the top surface thereof. The antiferromagnetic layer 304 may provide a horizontal exchange bias field to the perpendicular free magnetic layer 303 adjacent to a bottom surface of the antiferromagnetic layer 304.

The antiferromagnetic layer 304 may be formed of a material having a ferrimagnetic property.

The voltage applying unit (not shown) may apply a selection voltage to a unit cell, which is selected from a plurality of tunnel junction unit cells, and to which a process for the magnetization reversal will be performed. Accordingly, a specific one of the unit cells may be selected. In the selected unit cell, the magnetic anisotropy of the free magnetic layer 303 may be changed. Alternatively, due to a perpendicular current produced by the selection voltage, a spin transfer torque may be transferred to magnetization of the free magnetic layer 303. In this state, if an appropriate amount of an in-plane current is supplied through the antiferromagnetic layer 304 from an external current supplying part, a spin-orbit spin torque may be transferred to the free magnetic layer 303 to induce magnetization reversal of the free magnetic layer 303.

In the case where there is the in-plane current flowing through the conductive line structure 304/305, a spin-Hall or Rashba effect, in which up-spin and down-spin electrons are deflected in respectively different directions, may occur due to a spin-orbit interaction, and thus, a spin current may be produced in all directions orthogonal to the direction of the in-plane current. Here, a spin current in each direction may have a spin component deflected to be orthogonal to its direction. From the coordinate system of FIG. 3, if the in-plane current in the antiferromagnetic layer 304 flows in an x direction, a fraction of a spin current, which flows toward a −z direction (i.e., into the free magnetic layer 303), may have a spin component parallel to a y or −y direction.

Due to the spin current incident into the free magnetic layer 303, a spin-orbit spin torque may be exerted on the free magnetic layer 303. If, in addition to the exchange bias field (not shown) induced by the conductive line structure 304/305, the spin torque is applied to the free magnetic layer 303, the magnetization reversal of the free magnetic layer 303 may occur without the help of an external magnetic field.

Here, the exchange bias field may be used to replace the external magnetic field and may break the equilibrium of magnetization under a spin-orbit spin torque. This may make it possible to induce the magnetization reversal in a specific direction (e.g., from +z axis to −z axis or from −z axis to +z axis), according to a direction of an applied current.

In the conventional MTJ structure, a spin transfer torque may be produced by a current flowing in a perpendicular direction, and the spin transfer torque may be used to induce magnetization reversal of the free magnetic layer. By contrast, according to some embodiments of the inventive concept, a magnetic memory device may include the conductive line structure, which is provided adjacent to the free magnetic layer 303 and has the antiferromagnetic layer 304 and the ferromagnetic layer 305 having an in-plane magnetic anisotropy. When there is an in-plane current flowing through the conductive line structure, a spin-orbit spin torque may be produced by the in-plane current. The spin-orbit spin torque may be used to induce the magnetization reversal of the free magnetic layer 303, without an external magnetic field.

Furthermore, in the case of the magnetic memory device according to some embodiments of the inventive concept, if a selection voltage is applied to a specific unit cell, which is selected from a plurality of tunnel junction unit cells, magnetization of the specific unit cell may be selectively reversed.

Thus, it may be possible to overcome not only the problem of the conventional MTJ structure, which is operated using a current flowing in the perpendicular direction, but also the problem of the MTJ structure, which may occur when an insulating layer is thickened. For example, in the conventional MTJ structure, it is difficult to achieve both of low critical current density and high thermal stability, but this problem may be overcome. Also, if the insulating layer is thickened, the tunneling magnetoresistance may be increased to more quickly read a magnetization state, but this may lead to a reduction in current density and a difficulty in changing a magnetization state. However, this problem may also be overcome.

In addition, the magnetic memory device according to some embodiments of the inventive concept may have a structure, in which a critical current density for the magnetization reversal can be adjusted independent of a thickness of an insulating layer, which determines tunneling magnetoresistance. Also, a change in magnetic anisotropy of the free magnetic layer, which may be caused by applying a selection voltage to a selected cell, may be utilized for a cell selection. Alternatively, the existing spin torque produced by the selection voltage, along with the spin-orbit spin torque, may be utilized for the cell selection.

Also, it may be possible to avoid a problem, which may be found in the conventional MTJ structure. For example, when a current is applied to a non-magnetic conductive line adjacent to the free magnetic layer in an in-plane direction, an additional in-plane magnetic field should be needed, but it may be possible to avoid this problem.

In the magnetic memory device according to some embodiments of the inventive concept, it may be possible to reduce a size of a device and thereby to increase an integration density of the device. In addition, it may be possible to reduce a critical current density and increase a tunnel magnetoresistance (TMR) while maintaining thermal stability, and this make it possible to improve a reading speed of the magnetic memory device.

In some embodiments of the inventive concept, a current supplying part, which is connected to the conductive line structure and is used to supply a current, may be further provided. Meanwhile, the selection voltage to be applied to each unit cell may be provided from a voltage applying unit, which is connected to each cell and is used to apply a voltage. The current supplying part and the voltage applying unit may include, for example, a transistor or a diode.

Meanwhile, to selectively reverse magnetization of a specific MTJ cell, which is selected from a plurality of tunnel junction cells, the voltage applying unit may be configured to apply voltage (i.e., electric field) to the specific cell.

If voltage (i.e., electric field) is applied to a selected one of the tunnel junction unit cells (hereinafter, a specific unit cell) in the perpendicular direction, PMA energy density $K_\perp$ of the free magnetic layer included in the specific unit cell may be changed. In other words, if the selection voltage is applied to the tunnel junction unit cell, an electric field may be produced, and a PMA energy density of a magnetic material in the free magnetic layer may be changed, due to the produced electric field.

For example, if a change of the PMA energy density to be caused by applying the selection voltage V is expressed by $\Delta K_\perp(V)$, the effective anisotropic magnetic field $H_{K,eff}$ of the free magnetic layer may be replaced with $H_{K,eff}=2(K_\perp-\Delta K_\perp(V))/(M_S-NdM_S)$. Accordingly, when the voltage is applied, $H_{K,eff}$ may be decreased. Since $H_{K,eff}$ is a parameter representing how strong the magnetization of the free magnetic layer is maintained in the perpendicular direction, if a voltage is applied to reduce the $H_{K,eff}$, it may be possible to more easily reverse the magnetization of the free magnetic layer.

In addition, if a selection voltage is applied to the tunnel junction unit cell in a perpendicular direction, a current flowing in a perpendicular direction may be partially produced, depending on resistance of the MTJ. The current flowing in the perpendicular direction may be spin-polarized by the pinned magnetic layer 301 to apply a spin transfer torque to the free magnetic layer 303, in addition to the spin-orbit spin torque. Thus, it may be possible to reduce the total power required for a switching operation, and this may make it possible to realize a selective switching.

Figure 4:
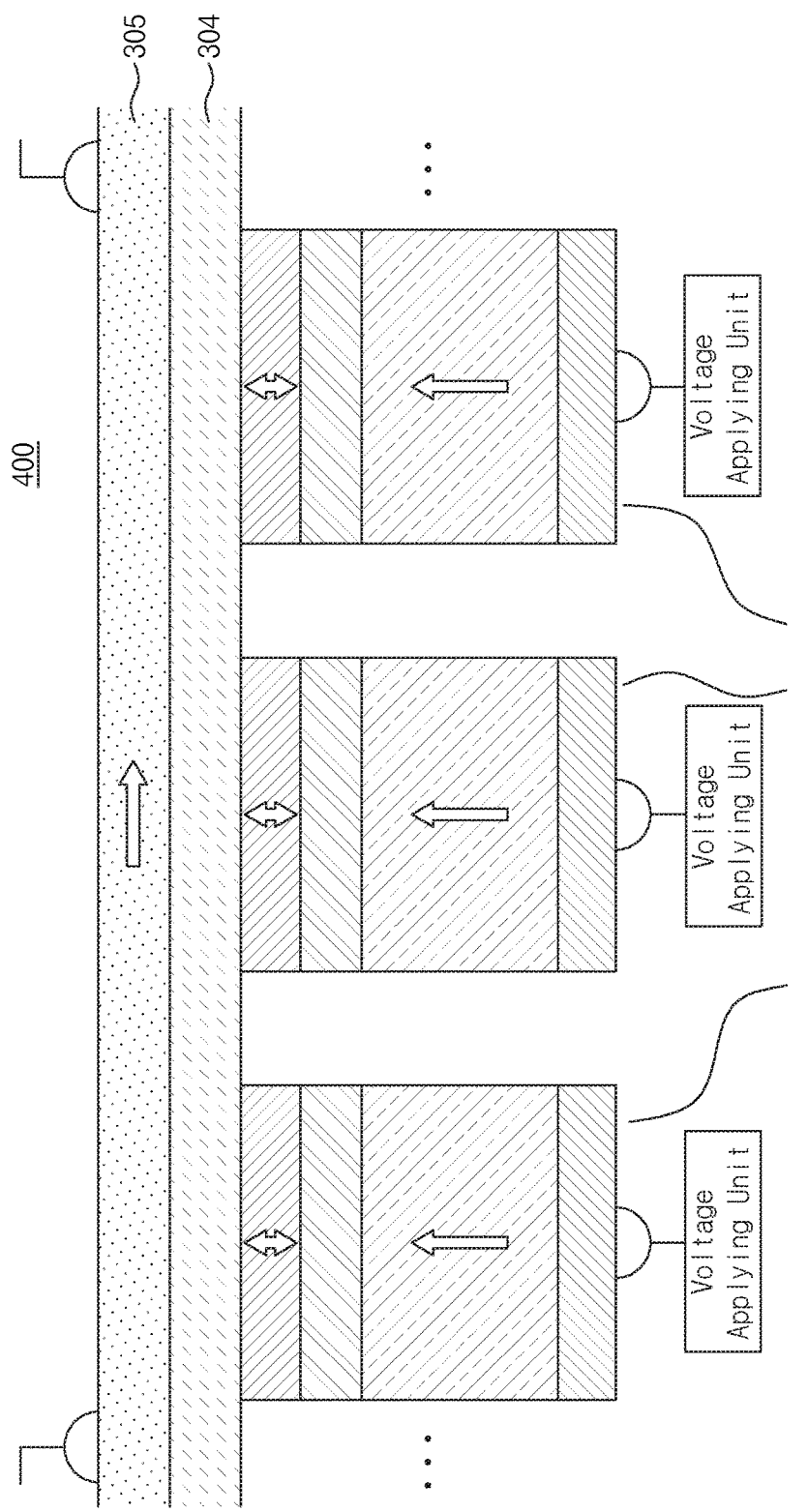
FIG. 4 is a sectional view illustrating a magnetic memory device, in which a plurality of tunnel junction unit cells are connected to a conductive line structure, according to some embodiments of the inventive concept.

FIG. 4 is a sectional view illustrating a magnetic memory device, in which a plurality of tunnel junction unit cells are connected to a conductive line structure, according to some embodiments of the inventive concept.

Referring to FIG. 4, in a magnetic memory device according to some embodiments of the inventive concept, a plurality of tunnel junction unit cells may be coupled to a conductive line structure including an antiferromagnetic layer 304 and a ferromagnetic layer 305.

A current supplying part, which is connected to the antiferromagnetic and ferromagnetic layers 304 and 305 adjacent to each other, may be used to flow an in-plane current through the conductive line structure, and thereby to exert a spin-orbit spin torque to all of unit cells which are coupled to the conductive line structure 304/305.

Here, a voltage applying unit connected to each of the unit cells may be configured to apply a voltage to a specific unit cell and to produce an electric field, which is used to selectively induce magnetization reversal of the specific unit cell.

If a plurality of tunnel junction unit cells 401 are provided to be in contact with the conductive line structure 304/305 and an in-plane current is applied to the tunnel junction unit cells 401 through the conductive line structure 304/305, it may be possible to selectively reverse magnetization of the free magnetic layer in the specific unit cell, owing to the afore-described principle.

The in-plane current flowing through the conductive line structure 304/305 may be provided from a current supplying part, which is connected to an end portion of the conductive line structure 304/305.

Here, if a spin-orbit spin torque, which is produced by the in-plane current supplied to the conductive line structure 304/305, and a magnitude of a horizontal exchange bias field, which is induced in the free magnetic layer by the conductive line structure including the antiferromagnetic layer 304 and the ferromagnetic layer having the in-plane magnetic anisotropy, are large enough to overcome the PMA of the free magnetic layer, the magnetization reversal may occur in the free magnetic layer that is included in each of unit cells connected to the conductive line structure.

However, if in the state that a relatively low in-plane current is supplied, a selection voltage is independently applied to only a specific unit cell to be selected, the PMA of the free magnetic layer in the selected unit cell may be reduced or the magnetization reversal may selectively occur in only the selected unit cell, with the help of an additional spin torque caused by a perpendicular current.

The selection voltage independently applied to the specific unit cell may be provided from the voltage applying unit independently connected to each cell. Here, an in-plane current, which is the same as that for the selected cell, may be applied to an unselected unit cell through the conductive line structure 304/305, but since a magnitude thereof is not large enough to overcome the PMA of the free magnetic layer, the magnetization reversal may not occur.

In other words, if in the state that an appropriate amount of an in-plane current is applied to the conductive line structure 304/305, a selection voltage is applied to only a unit cell to be selected, the magnetization reversal may occur in only the selected unit cell. In this case, since the in-plane current producing the spin-orbit spin torque flows through the conductive line structure 304/305 in the in-plane direction, it may be independent of thermal stability and tunneling magnetoresistance of the device, and thus, it may be possible to realize a magnetic memory device with improved thermal stability and high tunneling magnetoresistance.

Preferably, in order to obtain a high current density, a patterning technology may be used to realize a structure whose size is as small as possible, in the magnetic memory device according to some embodiments of the inventive concept.

To obtain the effect of the present disclosure, a first conductive layer, which is adjacent to the free magnetic layer with PMA and has an antiferromagnetic property, should be configured (i) to induce a horizontal exchange bias field at an interface between the free magnetic layer and the first conductive layer and (ii) to allow a current flowing into the first conductive layer to produce a spin-orbit spin torque. It is known that an antiferromagnetic layer adjacent to a magnetic layer having the in-plane magnetic anisotropy can produce a horizontal exchange bias field in the magnetic layer having the in-plane magnetic anisotropy. However, technically, it is not easy to produce a horizontal exchange bias field in a magnetic layer with PMA, using an antiferromagnetic layer adjacent to the magnetic layer with PMA. This is because a direction of an exchange bias field to be produced by an antiferromagnetic layer adjacent to a magnetic layer is determined by a magnetization direction of the magnetic layer adjacent to the antiferromagnetic layer, and in more detail, this is because the direction of the exchange bias field is determined by a thermal annealing process performed under a magnetic field, after forming a layer structure. In other words, an antiferromagnetic ordering of an antiferromagnetic layer adjacent to an magnetic layer with an in-plane magnetic anisotropy may be aligned in an in-plane manner, thereby producing a horizontal exchange bias field, whereas an antiferromagnetic ordering of an antiferromagnetic layer adjacent to a perpendicularly-magnetized magnetic layer with a perpendicular magnetic anisotropy may be aligned in a perpendicular manner, thereby producing a perpendicular exchange bias field.

As the first condition for obtaining technical effects of the present disclosure, the antiferromagnetic layer adjacent to the free magnetic layer with PMA should produce a horizontal exchange bias field in the free magnetic layer with PMA.

In some embodiments, a magnetic layer, which is provided to be in surface contact with a top surface of the antiferromagnetic layer adjacent to the free magnetic layer with PMA and has an in-plane magnetic anisotropy, may be provided. Thus, in the case where a thermal annealing process is performed under a horizontal magnetic field, the antiferromagnetic layer may be antiferromagnetically aligned to the in-plane direction, due to an exchange interaction between the magnetic layer having the in-plane magnetic anisotropy and the antiferromagnetic layer. Due to the antiferromagnetic ordering, a horizontal exchange bias field may be induced in the free magnetic layer with PMA adjacent to other side.

Meanwhile, as the second condition for obtaining technical effects of the present disclosure, a spin-orbit spin torque should be produced by a current flowing through a conductive line with an antiferromagnetic layer, and for this, an anomalous Hall effect or spin Hall effect should occur. According to a recently-reported theoretical study (H. Chen et al., Phys. Rev. Lett. 112, 017205 (2014)), a very large anomalous Hall effect is expected to be found in IrMn, one of typical antiferromagnetic materials. In addition, according to a recently-reported experimental study (J. B. S. Mendes et al., Phys. Rev. B 89, 140406(R), (2014)), a very large inverse spin Hall effect, similar to that of Pt, was found in IrMn. Since, owing to the Onsager relation, the inverse spin Hall effect is a reaction of a spin Hall effect, this experimental result means that a spin Hall effect exists in IrMn, but this reaction (i.e., a spin-orbit spin transfer torque by an antiferromagnetic material) has not been observed so far. In the experiment performed by the present inventors, it was observed that the spin-orbit spin torque was produced in IrMn; that is, the existence of the spin-orbit spin torque in IrMn has been proved.

Accordingly, it is possible to satisfy the two conditions required to obtain technical effects of the present disclosure; that is, (1) the conductive line, which is provided adjacent to the free magnetic layer with PMA and has an antiferromagnetic property, should be configured to induce a horizontal exchange bias field in the free magnetic layer and (ii) a current flowing in the conductive line should produce a spin-orbit spin torque.

Example Embodiment

In a comparative example 1, a conventional structure with a spin-orbit spin transfer torque was used to show that a magnetic memory device according to some embodiments of the inventive concept is effective. A structure of Ta (5 nm)/CoFeB (1 nm)/MgO (1.6 nm) was used in the comparative example 1.

Meanwhile, in order to obtain the effects of the present disclosure, a structure of Ta (5 nm)/IrMn (5 nm)/CoFeB (1 nm)/MgO (1.6 nm) was prepared. In this example embodiment, a CoFeB layer was used as a free magnetic layer with PMA, and an IrMn layer with an antiferromagnetic property (Ir:Mn=1:3) was provided to be adjacent to the CoFeB layer.

A sign of a spin-orbit spin transfer torque was measured from the structure of each of the comparative example 1 and the example embodiment. Here, a Hall bar having a width of 5 μm was patterned, and then, 1st harmonic Hall signal $V_{1\omega}$ and 2nd harmonic Hall signal $V_{2\omega}$ were measured using lock-in equipment while applying an AC current (frequency=50 Hz).

Also, $V_{1\omega}$ and $V_{2\omega}$ were measured while applying an external magnetic field in the same direction (i.e., x direction) as the current or in an in-plane direction (i.e., y direction) perpendicular to the current. $V_{1\omega}$ was measured to find how far the magnetization deviated from the perpendicular direction, and $V_{2\omega}$ was measured to find the sign and magnitude of the spin-orbit spin transfer torque (e.g., see K. Garello et al., Nature Nanotechnology 8, 587-593 (2013)).

Experimental Example 1

On whether or not spin-orbit spin transfer torque occurs in the magnetic memory device according to the inventive concept.

Figure 5:
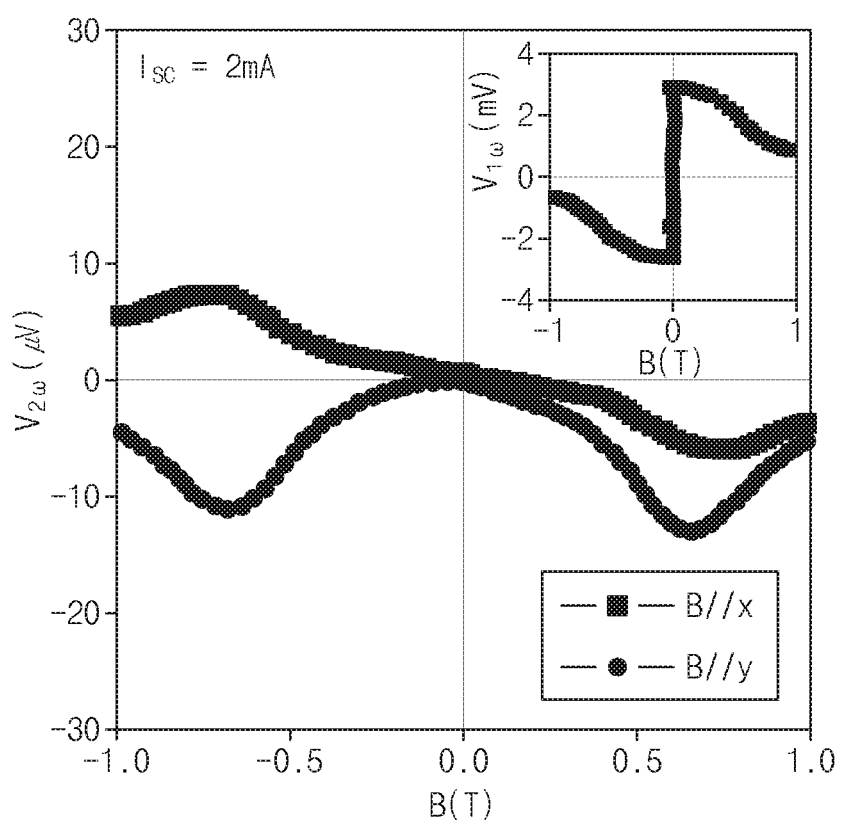
FIG. 5 is a graph showing a spin-orbit spin transfer torque measured from a conventional spin-orbit spin transfer torque magnetic memory device, to which an in-plane AC current was applied.
Figure 6:
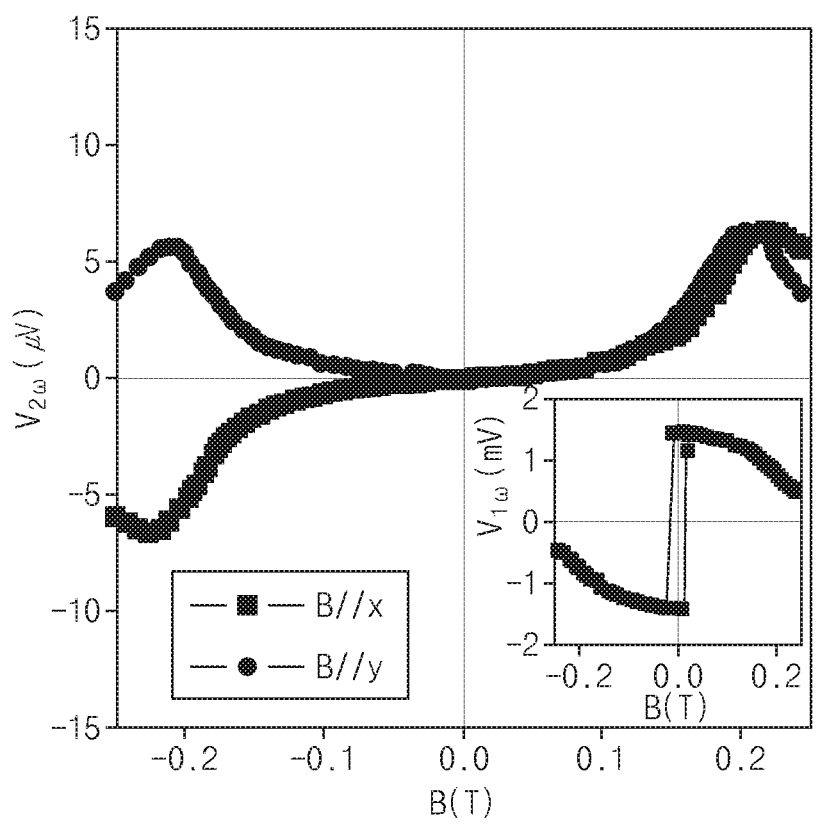
FIG. 6 is a graph showing a spin-orbit spin transfer torque measured from a conductive line structure with an antiferromagnetic layer, according to some embodiments of the inventive concept.

FIG. 5 is a graph showing a spin-orbit spin transfer torque measured from a conventional spin-orbit spin transfer torque magnetic memory device, to which an in-plane AC current was applied. FIG. 6 is a graph showing a spin-orbit spin transfer torque measured from a conductive line structure with an antiferromagnetic layer, according to some embodiments of the inventive concept.

Referring to FIGS. 5 and 6, the signs of $V_{1\omega}$ in the two structures were the same, and when $V_{2\omega}$ was obtained by applying an external magnetic field (B) in an x or y direction, the signs of $V_{2\omega}$ in the two structures were opposite to each other. The experiment data show that, when there is an antiferromagnetic IrMn layer (or an antiferromagnetic layer) adjacent to a CoFeB layer (or a free magnetic layer), a spin-orbit spin transfer torque is produced and the sign thereof is opposite to that of a spin-orbit spin transfer torque caused by Ta.

Experimental Example 2

On whether or not magnetization of free magnetic layer is reversed when only current, without any external magnetic field, is applied to the magnetic memory device according to the inventive concept.

Figure 2:
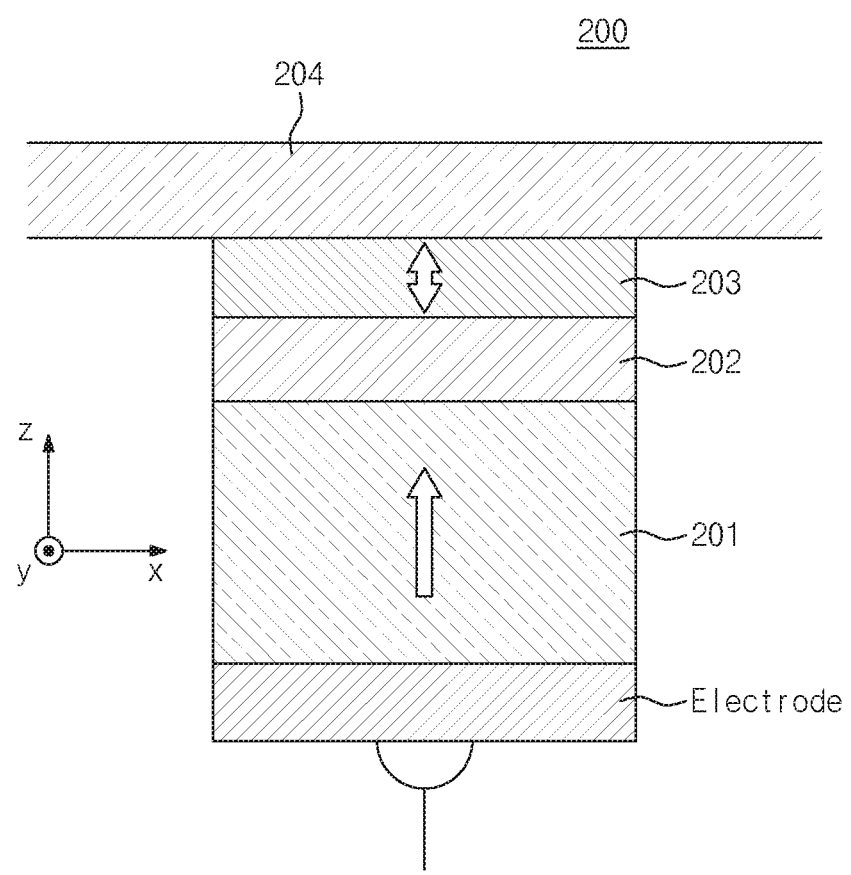
FIG. 2 is a sectional view illustrating a conventional magnetic memory device including tunnel junction unit cells, each of which has a conventional MTJ structure using a spin-orbit spin transfer torque and an external magnetic field.
Figure 7:
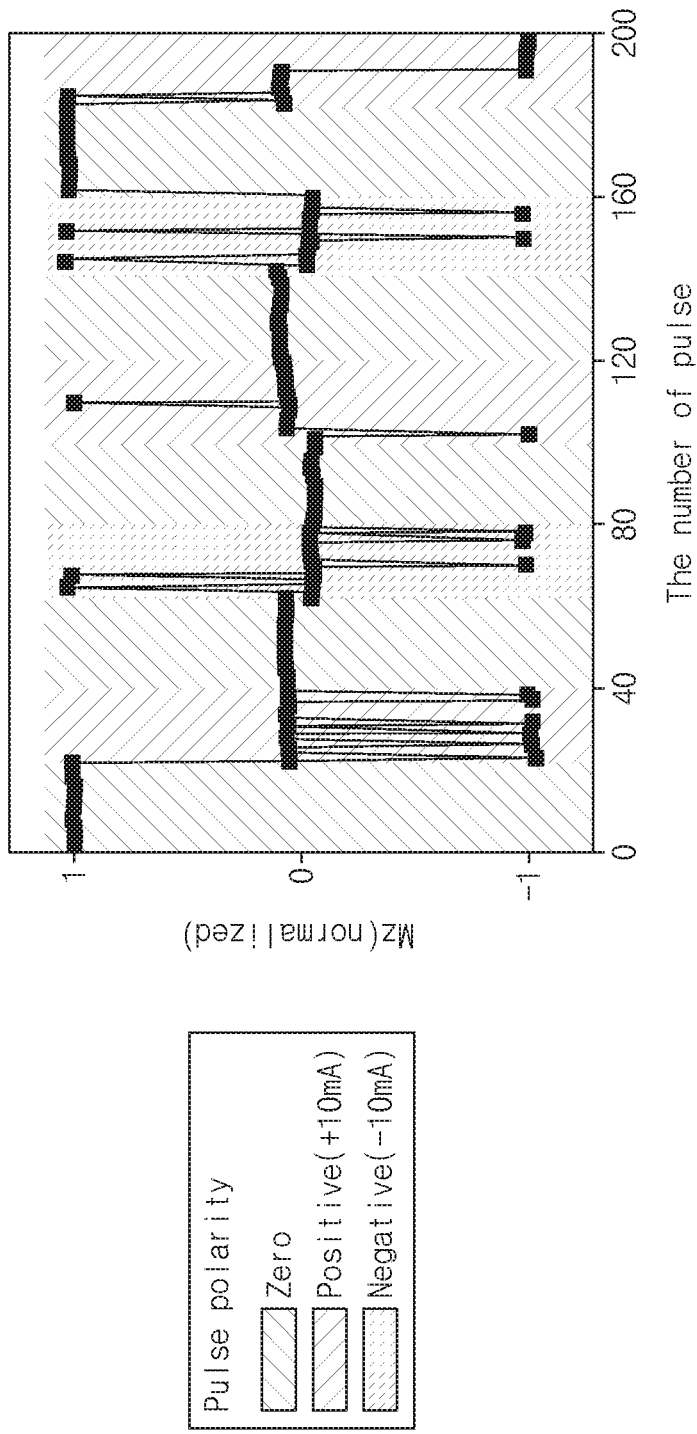
FIG. 7 is a graph showing a magnetization reversal behavior of a free magnetic layer that was measured when there was no external magnetic field and an in-plane current was applied to a non-magnetic conductive line of the conventional spin-orbit spin torque magnetic memory device of FIG. 2.

FIG. 7 is a graph showing a magnetization reversal behavior of a free magnetic layer that was measured when there was no external magnetic field and an in-plane current was applied to a non-magnetic conductive line of the conventional spin-orbit spin torque magnetic memory device of FIG. 2.

The graph of FIG. 7 shows a magnetization reversal behavior in a conventional structure of Ta (5 nm)/Ti (5 nm)/CoFeB (1 nm)/MgO (1.6 nm), when an in-plane current, without an external magnetic field, was applied to realize the magnetization reversal. When a positive or negative current was applied, normalize perpendicular component, Mz, of the magnetization was not changed to +1 or −1 and was randomly changed. This result agrees with the previous study (I. M. Miron et al., Nature 476, 189-193 2011), in which, when there is no external magnetic field, the spin-orbit spin transfer torque cannot be used to reverse a perpendicular magnetization to a specific direction.

Figure 8:
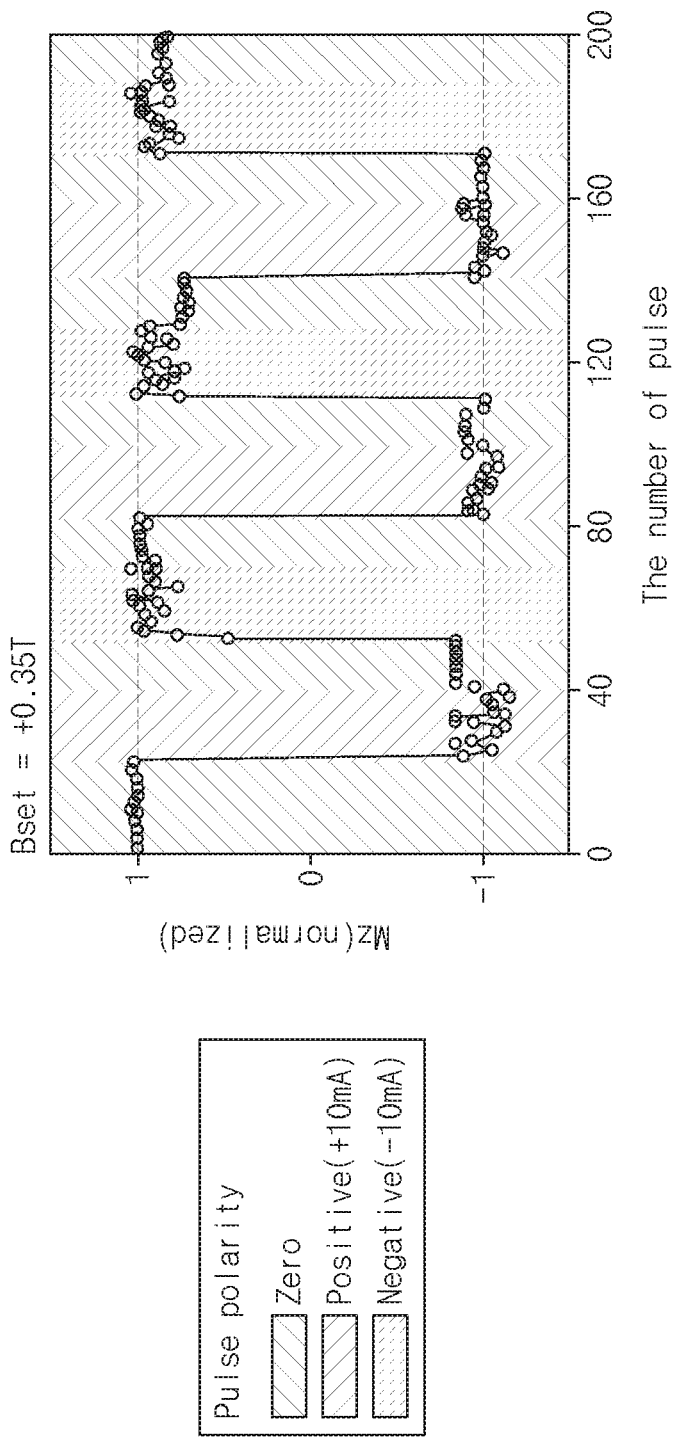
FIGS. 8 and 9 are graphs showing a magnetization reversal behavior of a free magnetic layer that was measured when only an in-plane current was applied to a conductive line structure of a spin-orbit spin torque magnetic memory device according to some embodiments of the inventive concept.
Figure 9:
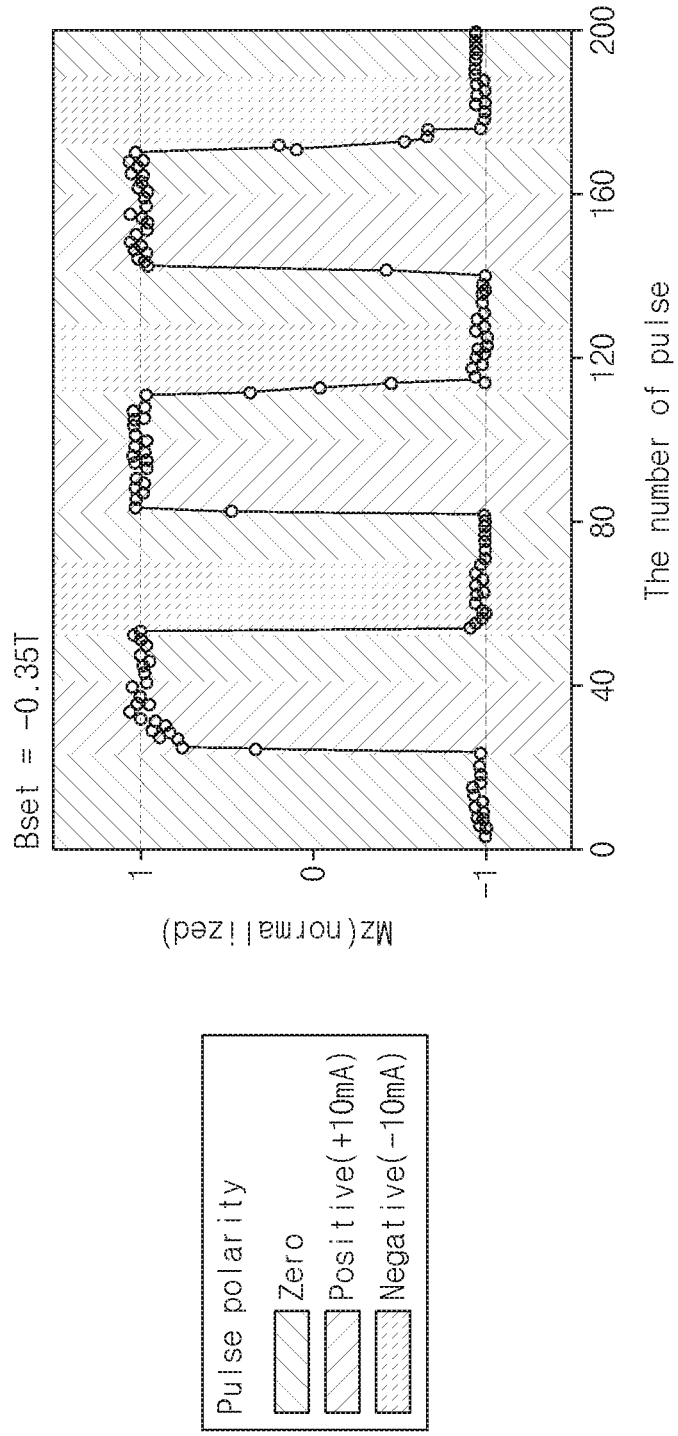

FIGS. 8 and 9 are graphs showing a magnetization reversal behavior of a free magnetic layer that was measured when only an in-plane current was applied to a conductive line structure of a spin-orbit spin torque magnetic memory device according to some embodiments of the inventive concept.

The graphs of FIGS. 8 and 9 show a magnetization reversal behavior in a magnetic memory device, in which a structure of Ta (5 nm)/CoFeB (3 nm)/IrMn (3 nm)/CoFeB (1 nm)/MgO (1.6 nm) is provided, according to some embodiments of the inventive concept, when an in-plane current, without an additional external magnetic field, was applied.

In the magnetic memory device, CoFeB (1 nm) was used as a free magnetic layer exhibiting a perpendicular magnetic anisotropy (PMA) property. IrMn (3 nm) was used as an antiferromagnetic layer, and CoFeB (3 nm) was used as a ferromagnetic layer exhibiting an in-plane perpendicular anisotropy property.

Referring to FIG. 8, before the magnetization reversal experiment, an external magnetic field (Bset) was applied in an +x direction to perfectly align the CoFeB (3 nm) layer having the in-plane magnetization to the +x direction, and then, in a state without the external magnetic field, an in-plane current was measured to find whether the magnetization reversal occurred or not. When a positive current was applied, Mz was changed from +1 to −1, and when a negative current was applied, Mz was changed from −1 to +1. That is, even if there was no external magnetic field, it was possible to selectively realize magnetization reversal of perpendicular magnetization using an in-plane current.

Referring to FIG. 9, before the magnetization reversal experiment, an external magnetic field (Bset) was applied in an −x direction to perfectly align the CoFeB (3 nm) layer having the in-plane magnetization to the −x direction, and then, in a state without the external magnetic field, an in-plane current was measured to find whether the magnetization reversal occurred or not. In other words, compared with the case of FIG. 8, in which the external magnetic field (B set) was applied in the +x direction, the magnetization reversal of exactly opposite direction was observed.

The results of FIG. 8 and FIG. 9 show that a direction of the in-plane exchange bias field is determined by the external magnetic field (B set) before the magnetization reversal experiment and thus, in a situation without the external magnetic field, the in-plane exchange bias field may act like the external magnetic field. That is, the results of FIGS. 8 and 9 prove that it is possible to realize selective magnetization reversal of perpendicular magnetization.

In a magnetic memory device according to some embodiments of the inventive concept, a spin-orbit spin torque may be produced in the free magnetic layer, when an in-plane current flows through a conductive line structure adjacent to a free magnetic layer. Meanwhile, the conductive line structure may include an antiferromagnetic layer having an antiferromagnetic property and a ferromagnetic layer having an in-plane magnetic anisotropy, and due to an exchange interaction between the antiferromagnetic and ferromagnetic layers of the conductive line structure, an antiferromagnetic ordering may occur in the antiferromagnetic layer. Due to the antiferromagnetic ordering, a horizontal exchange bias field may be induced in the free magnetic layer.

Accordingly, the magnetization reversal of the free magnetic layer may be achieved without the help of an additional external magnetic field. Alternatively, a selection voltage to be applied to each magnetic memory cell may be used to change magnetic anisotropy of the free magnetic layer in each cell or a spin transfer torque may be generally produced to realize the selective magnetization reversal of a specific cell. When a spin-orbit spin torque is used for the magnetization reversal, a critical current density may be proportional to perpendicular magnetic anisotropy and volume of the free magnetic layer, like that of the conventional structure, but may be inversely proportional to an amount of a spin current with respect to an applying current, which is generated from a spin Hall or Rashba effect.

In the case where a volume of a device is decreased to increase an integration density of the device, the PMA may be increased to ensure thermal stability, and at the same time, an amount of a spin current to be produced may be effectively increased to reduce a critical current density. That is, it may be possible to meet technical requirements associated with thermal stability and critical current density of the magnetic memory device.

Meanwhile, a spin-orbit spin torque may be produced, and thus, an in-plane current flowing through the conductive line structure, not a current flowing through the device in a perpendicular direction, may be used for the magnetization reversal. Thus, a current supplying part for supplying the current may be disposed outside an array of tunnel junction unit cells, each of which has a magnetic tunnel junction (MTJ) structure. Accordingly, a size or arrangement of the current supplying part may be relatively freely changed, regardless of a size of each tunnel junction unit cell. Thus, in order to allow a current, which is used to produce a spin-orbit spin torque and induce the magnetization reversal, to have a current density higher than a critical current density, the current supplying part may provide an advantage of supplying a relatively large amount of current to the conductive line structure.

In the conventional structure, an electron may tunnel through an insulating layer in a tunnel junction unit cell, and in this case, a spin torque of the electron may be transferred to magnetization of the free magnetic layer. By contrast, a spin-orbit spin torque may occur at an interface between the free magnetic layer and a conductive line. Thus, it is not necessary to produce a relatively large amount of positive current flowing or tunneling through the insulating layer in the MTJ structure. Accordingly, a critical current density may not be affected, even when a thickness of the insulating layer is increased and tunnel magnetoresistance is sufficiently increased.

As a result, in the case where the insulating layer is thickened, the tunneling magnetoresistance may be increased, regardless of the critical current density, and thus, a magnetization state may be read at an increased speed.

In the case where a thickness of the insulating layer is maintained to allow for electron tunneling, a spin-orbit spin torque effect caused by an in-plane current may be further produced, in addition to a typical spin torque transfer effect caused by a perpendicular current. Thus, a current density of an electric current flowing through the insulating may be remarkably small, compared to the case that only the typical spin torque transfer effect by the perpendicular current is used for magnetization reversal, and accordingly, it may be possible to reduce power to be consumed to operate the magnetic memory device and to improve stability of an insulating layer provided in the magnetic memory device.

INDUSTRIAL AVAILABILITY

The magnetic memory device according to some embodiments of the inventive concept may be used, for example, to realize a spin-orbit spin torque magnetic memory device.

What is claimed is:

1. A magnetic memory device, comprising:
    tunnel junction unit cells, each including a pinned magnetic layer, an insulating layer, and a free magnetic layer which are sequentially stacked;
    a conductive line structure configured to supply an in-plane current and connected to the unit cells, the conductive line structure comprising an antiferromagnetic layer, which is provided adjacent to the free magnetic layer, and a ferromagnetic layer, which is provided adjacent to the antiferromagnetic layer and has an in-plane magnetic anisotropy; and
    a voltage applying unit configured to independently apply a selection voltage to each of the tunnel junction unit cells, wherein each of the tunnel junction unit cells has a magnetization direction that is selectively changed by the in-plane current and the selection voltage;
    wherein the in-plane current flows through both the antiferromagnetic layer of the conductive line structure and the ferromagnetic layer of conductive line structure;
    wherein the antiferromagnetic layer of the conductive line structure and the ferromagnetic layer of conductive line structure are elongated to the conductive line structure; and
    wherein the conductive line structure is configured to induce a horizontal exchange bias field in the free magnetic layer, and the in-plane current flowing through the conductive line structure produces a spin-orbit spin torque.

2. The magnetic memory device of claim 1, wherein the pinned magnetic layer and the free magnetic layer are formed of at least one ferromagnetic materials selected from a group consisting of Fe, Co, Ni, B, Si, Zr, Pt, Tb, Pd, Cu, and W.

3. The magnetic memory device of claim 1, wherein the insulating layer is formed of a material selected from AlOx, MgO, TaOx, ZrOx, and mixtures thereof.

4. The magnetic memory device of claim 1, wherein each of the antiferromagnetic and ferromagnetic layers included in the conductive line structure is formed of at least one of metallic materials selected from a group consisting of Co, Fe, Ni, Cu, Ta, Pt, W, Hf, Ir, Rh, Pd, Gd, Bi, Ir, and Mn.

5. The magnetic memory device of claim 1, wherein the antiferromagnetic layer is formed of a material having a ferrimagnetic property and is provided to be in surface contact with the free magnetic layer.

6. The magnetic memory device of claim 1, wherein the free magnetic layer has perpendicular magnetic anisotropy (PMA).

7. The magnetic memory device of claim 1, wherein the antiferromagnetic layer and the ferromagnetic layer are provided to be in surface contact with each other.

8. The magnetic memory device of claim 1, wherein the ferromagnetic layer is configured to induce a horizontal exchange bias in the antiferromagnetic layer, through a thermal annealing process under a horizontal magnetic field.

* * * * *